United States Patent
Lee et al.

(10) Patent No.: US 8,040,156 B2
(45) Date of Patent: Oct. 18, 2011

(54) LOCK DETECTION CIRCUIT AND LOCK DETECTING METHOD

(75) Inventors: Hui Dong Lee, Daejeon (KR); Kwi Dong Kim, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 62 days.

(21) Appl. No.: 12/466,283

(22) Filed: May 14, 2009

(65) Prior Publication Data

US 2010/0052752 A1    Mar. 4, 2010

(30) Foreign Application Priority Data

Sep. 4, 2008 (KR) .................. 10-2008-0087332

(51) Int. Cl.
*H03K 5/19* (2006.01)

(52) U.S. Cl. ............... 327/20; 327/23; 327/24; 327/39; 327/43; 327/47; 327/49

(58) Field of Classification Search .......... None
See application file for complete search history.

(56) References Cited

U.S. PATENT DOCUMENTS

| | | | | |
|---|---|---|---|---|
| 5,008,635 | A | * | 4/1991 | Hanke et al. ................ 331/1 A |
| 5,530,383 | A | * | 6/1996 | May ................................. 327/39 |
| 5,909,130 | A | * | 6/1999 | Martin et al. ................... 327/12 |
| 5,969,576 | A | * | 10/1999 | Trodden ........................ 331/1 A |
| 6,670,834 | B1 | * | 12/2003 | Swanson ....................... 327/156 |
| 6,744,838 | B1 | | 6/2004 | Dixit |
| 6,927,635 | B2 | * | 8/2005 | Miki et al. .................... 331/1 A |
| 7,015,727 | B2 | * | 3/2006 | Balasubramanian .......... 327/49 |
| 7,676,014 | B2 | * | 3/2010 | Chen et al. .................... 375/376 |
| 2005/0084051 | A1 | * | 4/2005 | Nauta et al. ................... 375/376 |
| 2007/0285082 | A1 | | 12/2007 | Kimura et al. |
| 2007/0285132 | A1 | | 12/2007 | Oh |

FOREIGN PATENT DOCUMENTS

| | | |
|---|---|---|
| JP | 09-214333 A | 8/1997 |
| KR | 1020070061049 A | 6/2007 |
| KR | 1020080031536 A | 4/2008 |

* cited by examiner

*Primary Examiner* — Tuan Lam

(57) ABSTRACT

Provided are a lock detection circuit and a lock detecting method. The lock detection circuit includes two delay devices, four flip-flops and two logic gates, and can accurately detect a lock state of a phase locked loop (PLL) circuit. Therefore, the lock detection circuit can be implemented in a simple structure, and as a result, the lock detection circuit can be compact in size and can consume less electric power. Also, the lock detecting method enables lock detection process to be simpler, so that a lock state can be detected within a short time period.

11 Claims, 5 Drawing Sheets

LOCK DETECTION CIRCUIT AND LOCK DETECTING METHOD

CROSS-REFERENCE TO RELATED APPLICATION

This application claims priority to and the benefit of Korean Patent Application No. 10-2008-0087332, filed Sep. 4, 2008, the disclosure of which is incorporated herein by reference in its entirety.

BACKGROUND

1. Field of the Invention

The present invention relates to a lock detection circuit and a lock detecting method, and more particularly, to a lock detection circuit capable of detecting a lock state of a phase locked loop (PLL) circuit and a lock detecting method.

2. Discussion of Related Art

In transmitting and receiving a digital signal using a digital clock, in order to clearly identify whether a received signal is 0 or 1, it is necessary to accurately discern a location where each clock starts and stops. However, transmitting a signal in a wired or wireless configuration causes the signal to be delayed according to a signal path, and its phase to be changed as well. Therefore, it may be unclear for a receiving part to know which parts correspond to a start point and a stop point to determine 0 and 1.

Under these circumstances, a circuit that synchronizes a start point of a clock with its stop point is required, and a phase locked loop (PLL) circuit functions to synchronize a start (0 degree) with a stop (360 degrees) of a period.

The PLL circuit compares a phase of a reference signal with that of a feedback signal from a voltage controlled oscillator (VCO) to synchronize the phase. It is used in various applications such as a communication system, etc. Thanks to recent developments in semiconductor technology, the PLL circuit can be implemented as semiconductor integrated circuit.

FIG. 1 is a block diagram of a general PLL circuit.

Referring to FIG. 1, a PLL circuit 100 includes a first frequency divider 110 dividing a frequency of a reference signal FREF, a second frequency divider 120 dividing a frequency of a feedback signal FVCO, a phase frequency detector 130 comparing a phase of a frequency-divided reference signal FREF' with that of a frequency-divided feedback signal FVCO' to output an up signal UP or a down signal DN depending on a phase difference, a lock detection circuit 140 detecting a lock state according to the up signal UP or the down signal DN output from the phase frequency detector 130 to output a low or high lock detection signal LKD, a charge pump 150 pumping charge according to the up signal UP or the down signal DN output from the phase frequency detector 130, a loop filter 160 filtering a high frequency component from the signal output from the charge pump 150, and a VCO 170 varying a frequency of the output signal FVCO according to a control voltage output from the loop filter 160.

When a phase of the frequency-divided reference signal FREF' is faster than that of the frequency-divided feedback signal FVCO', the PLL circuit 100 raises an oscillation frequency so that a phase of the feedback signal FVCO becomes faster. Also, when a phase of the frequency-divided reference signal FREF' is slower than that of the frequency-divided feedback signal FVCO', the PLL circuit 100 lowers an oscillation frequency so that the phase of the feedback signal FVCO becomes delayed.

When the phase of the frequency-divided reference signal FREF' and that of the frequency-divided feedback signal FVCO' are locked by the synchronization, i.e., a high lock detection signal LKD is output from the lock detection circuit 140, an output of the VCO 170 may be used for various application circuits.

Therefore, the lock detection circuit 140 is able to accurately detect the lock state of the PLL circuit, and for this purpose, it is necessary for the up signal UP and the down signal DN, which are output from the phase frequency detector 130, to have an accurate state value.

The state value of the up signal UP and the down signal DN, which are output from the phase frequency detector 130, will be described below in detail.

FIG. 2A is a circuit diagram of a three-state phase frequency detector that is generally used in a PLL circuit, FIG. 2B illustrates a state machine of the phase frequency detector illustrated in FIG. 2A, and FIG. 2C is a timing diagram of the phase frequency detector illustrated in FIG. 2A.

Referring to FIG. 2A, the three-state phase frequency detector includes two D flip-flops and one AND gate, and in the detector, a phase difference between a frequency-divided reference signal FREF' and a frequency-divided feedback signal FVCO' is detected at rising edges of the two signals to output an up signal UP and a down signal DN. Here, as illustrated in FIG. 2B, when a phase of the frequency-divided reference signal FREF' is faster than that of the frequency-divided feedback signal FVCO', the state value moves to "state 0" or "state 1" depending on a former state. Further, when a phase of the frequency-divided reference signal FREF' is more delayed than that of the frequency-divided feedback signal FVCO', the state value moves to "state 0" or "state 2" depending on a former state. Moreover, when the frequency-divided reference signal FREF' and the frequency-divided feedback signal FVCO' are locked, "state 0" is maintained.

However, as illustrated in FIG. 2C, delayed time of each logic circuit device of the phase frequency detector may periodically cause an abnormal interval (Trst interval) in which both the up signal UP and the down signal DN become 1. Also, despite the unlock state, the lock detection circuit may detect a lock state.

Therefore, research into a lock detection circuit capable of taking the delayed time of a logic circuit device to accurately detect a lock state has been progressively carried out, and as a result, a lock detection circuit as illustrated in FIG. 3 has been disclosed.

FIG. 3 schematically illustrates a conventional lock detection circuit.

Referring to FIG. 3, the conventional lock detection circuit includes a delay circuit, seven NAND gates, two T-flip-flops, and four inverters, and only when a time difference between an up signal UP and a down signal DN is smaller than a predetermined reference signal FREF, a high lock detection signal LKD is output.

However, in order to implement the lock detection circuit, many logic circuit devices should be connected to each other, resulting in the complicated hardware implementation, its large size, and increased power consumption.

SUMMARY OF THE INVENTION

The present application is directed to a lock detection circuit capable of accurately detecting a lock state with a simple structure.

The present application is also directed to a lock detecting method capable of accurately detecting a lock state within a short time period.

One aspect of the present invention provides a lock detection circuit, including: a front-end lock detector receiving an up signal or a down signal based on a phase difference between a reference signal and a feedback signal, and outputting a preliminary lock detection signal indicating lock states of the reference signal and the feedback signal according to the up signal and the down signal. Here, the front-end lock detector includes: first and second delay devices respectively delaying the up and down signals for a predetermined time period and outputting them; a first D flip-flop receiving the delayed up signal and outputting the received signal in response to the down signal; a second D flip-flop receiving the delayed down signal and outputting the received signal in response to the up signal; and a NOR gate outputting a high or low preliminary lock detection signal depending on output signals of the first and second D flip-flops.

The lock detection circuit may further include a back-end lock detector receiving the preliminary lock detection signal from the front-end lock detector to output a preliminary lock detection signal that maintains a high state for a predetermined time period as a final lock detection signal.

The back-end lock detector may include: a third D flip-flop receiving the preliminary lock detection signal, delaying it as long as a time interval of the reference signal and outputting it; a fourth D flip-flop receiving the output signal of the third D flip-flop, delaying it as long as the time interval of the reference signal and outputting it; and an AND gate outputting a preliminary lock detection signal that maintains a high state for a predetermined time period according to the output signals of the third and fourth D flip-flops as a final lock detection signal.

Another aspect of the present invention provides a lock detecting method, including: delaying the up signal and the down signal for a predetermined time period when an up signal and a down signal are input according to a phase difference between a reference signal and a feedback signal; generating a first output signal when the delayed up signal is faster than the down signal, and generating a second output signal when the delayed down signal is faster than the up signal; and generating and outputting a preliminary lock detection signal indicating lock states of the reference signal and the feedback signal according to the first and second output signals.

In generating the first and second output signals, when the delayed up signal is faster than the down signal, the first output signal may be in a high state, and when the delayed down signal is faster than the up signal, the second output signal may be in a high state. In generating and outputting the preliminary lock detection signal, when the first and second output signals are in low states, the preliminary lock detection signal may be in a high state.

The lock detecting method may further include extracting a preliminary lock detection signal that maintains a high state for a predetermined time period from the preliminary lock detection signal generated in the process of generating and outputting the preliminary lock detection signal as a final lock detection signal.

The extracting of the preliminary lock detection signal may include: delaying the preliminary lock detection signal as long as a time interval of the reference signal; delaying the delayed preliminary lock detection signal as long as the time interval of the reference signal; and performing an AND operation on the first delayed preliminary lock detection signal and the second delayed preliminary lock detection signal to extract a preliminary lock detection signal maintaining a high state for a predetermined time period.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

Hereinafter, exemplary embodiments of the present invention will be described in detail. However, the present invention is not limited to the embodiments disclosed below, but can be implemented in various forms. Therefore, the following embodiments are described in order for this disclosure to be complete and enabling to those of ordinary skill in the art.

Figure 1:
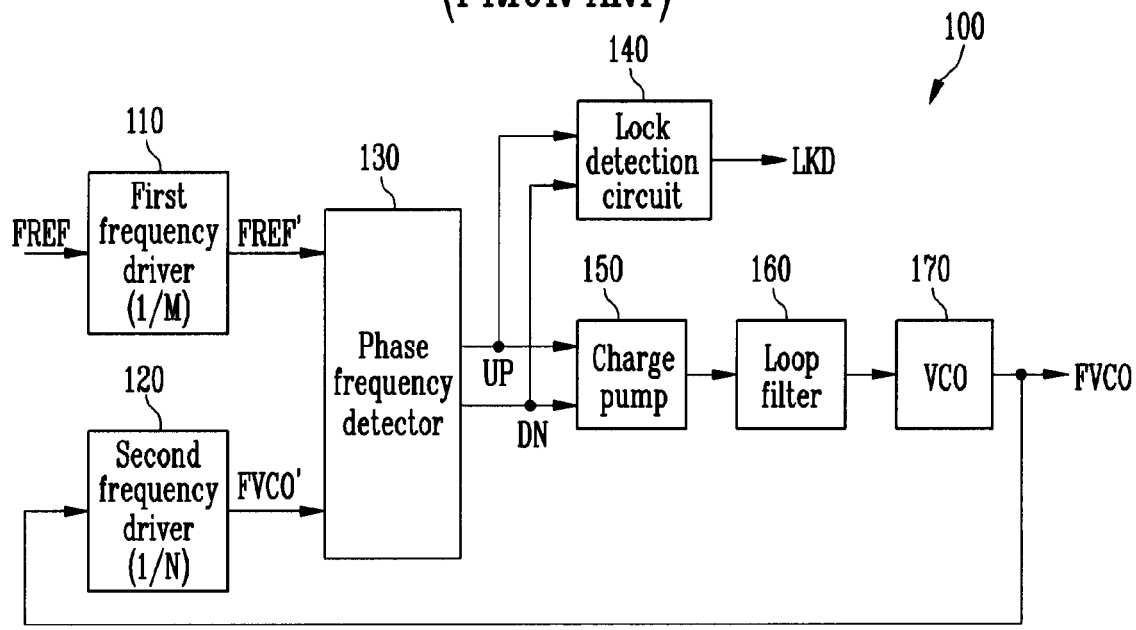
FIG. 1 is a block diagram of a general PLL circuit.
Figure 2A:
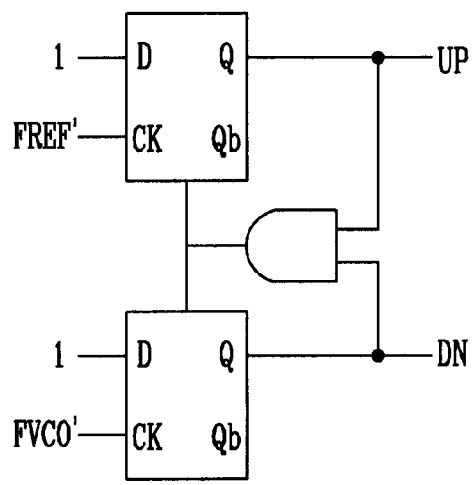
FIG. 2A is a circuit diagram of a three-state phase frequency detector that is generally used in a PLL circuit.
Figure 2B:
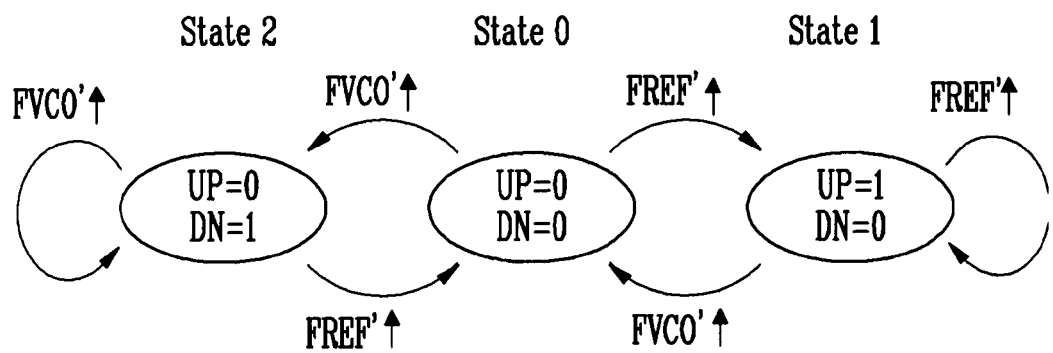
FIG. 2B illustrates a state machine of the phase frequency detector illustrated in FIG. 2A.
Figure 2C:
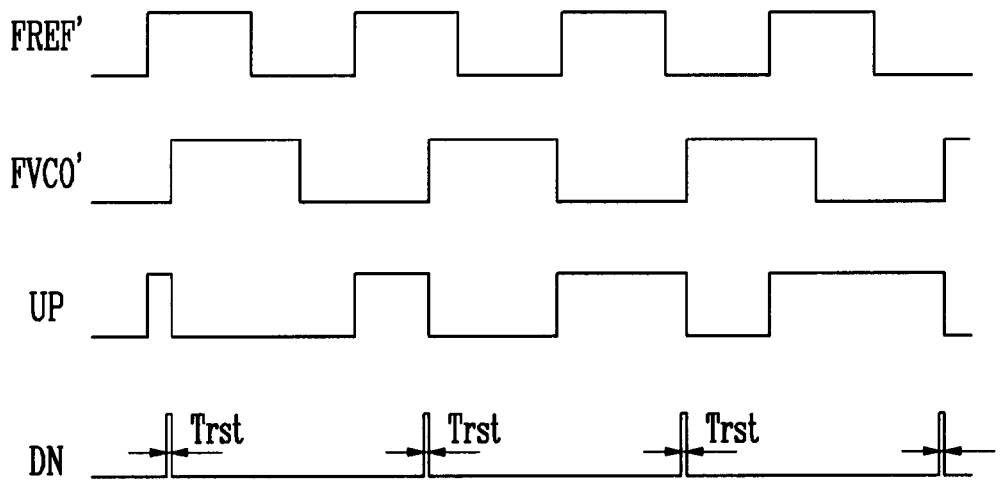
FIG. 2C is a timing diagram illustrating operations of the phase frequency detector illustrated in FIG. 2A.
Figure 3:
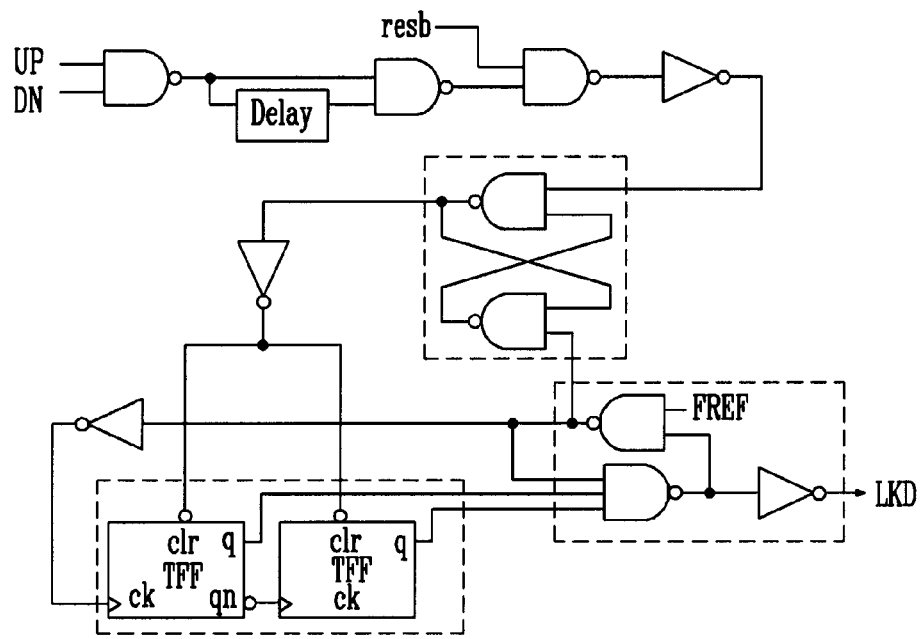
FIG. 3 schematically illustrates a conventional lock detection circuit.
Figure 4:
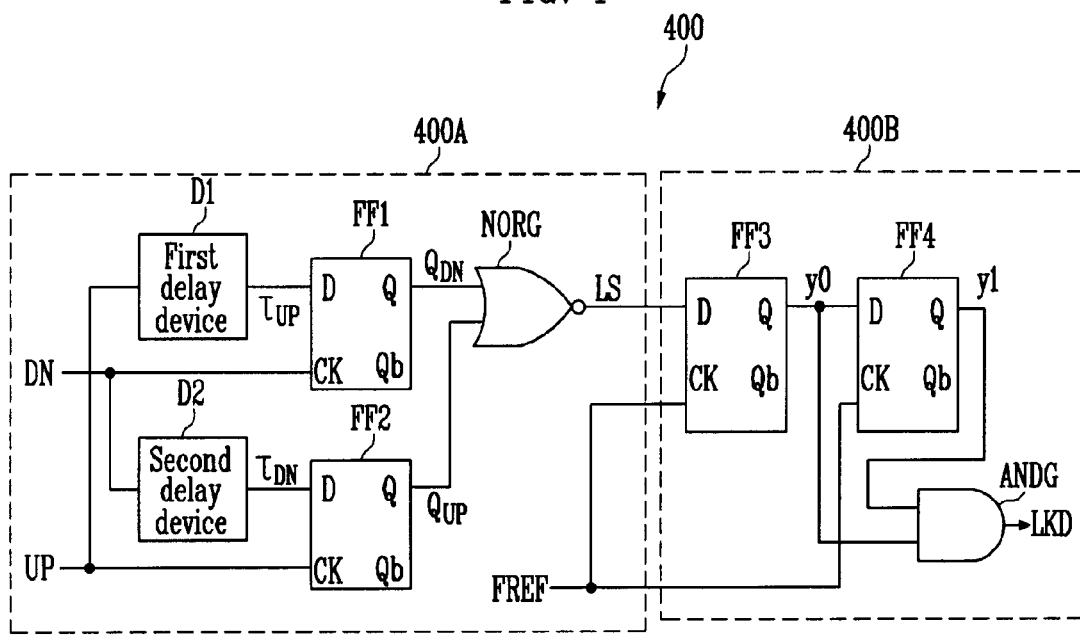
FIG. 4 illustrates a lock detection circuit according to an exemplary embodiment of the present invention.
Figure 5A:
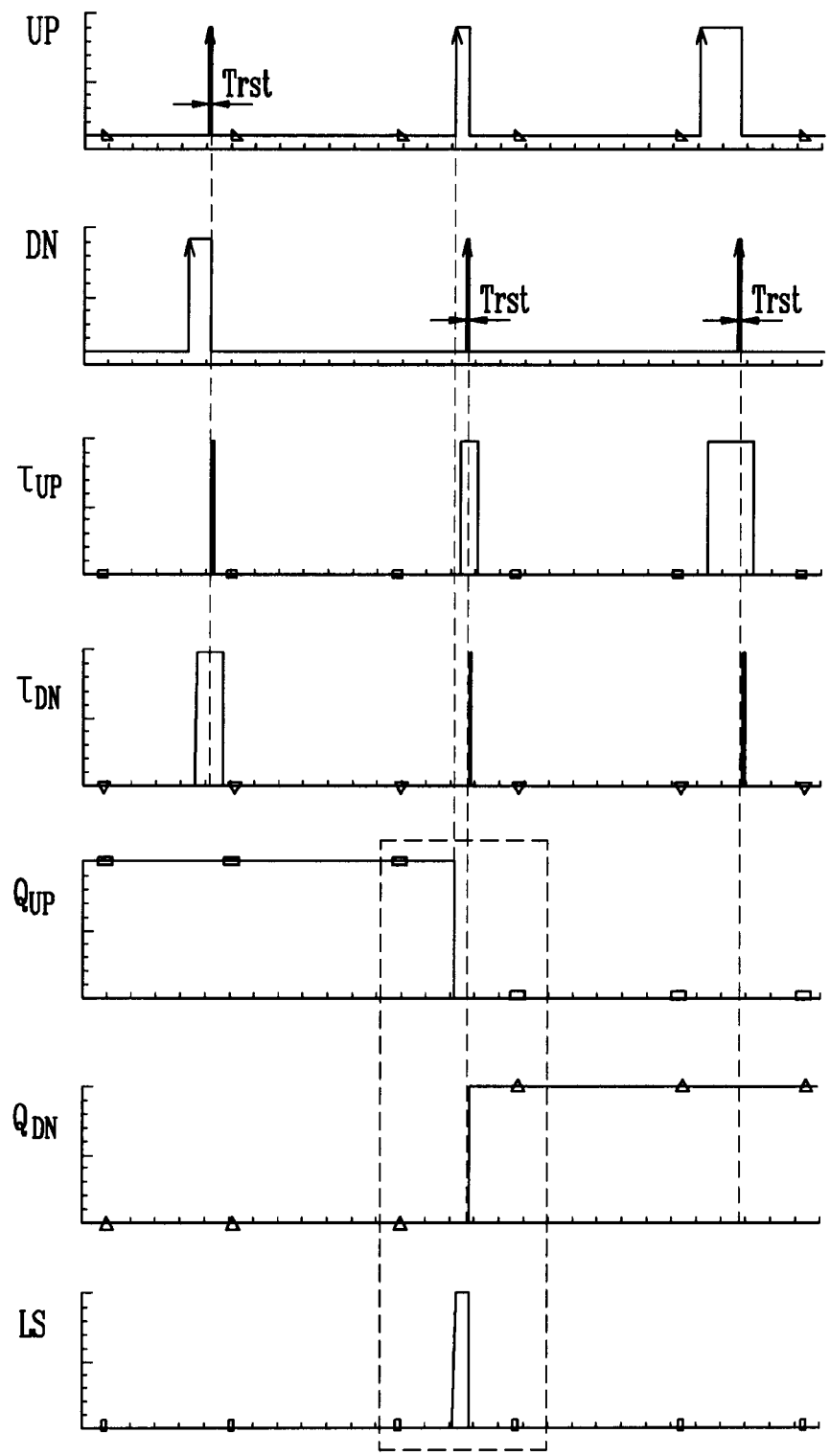
FIGS. 5A and 5B are timing diagrams illustrating operations of the lock detection circuit illustrated in FIG. 4.
Figure 5B:
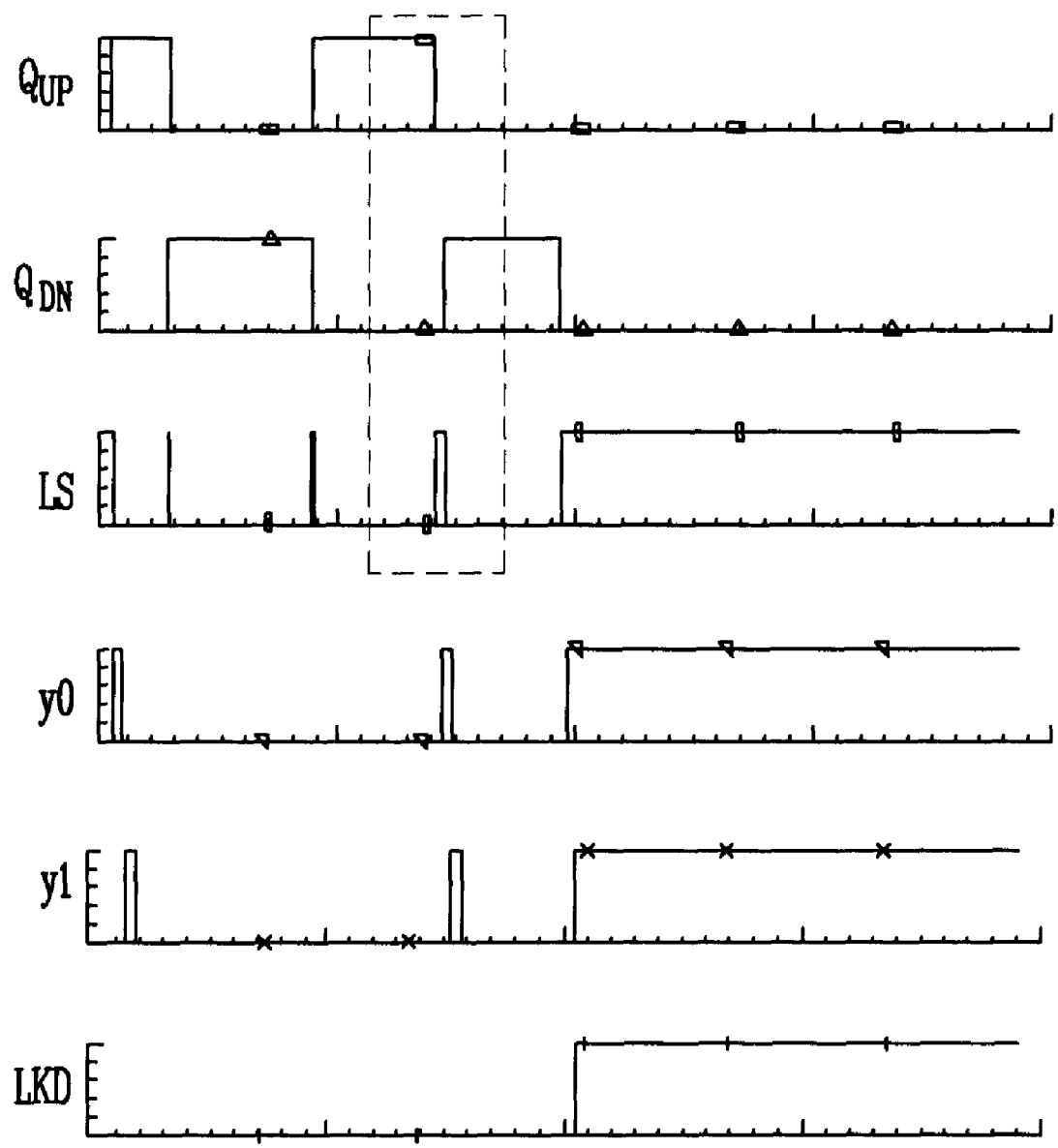

FIG. 4 illustrates a lock detection circuit according to an exemplary embodiment of the present invention, and FIGS. 5A and 5B are timing diagrams illustrating operation of the lock detection circuit illustrated in FIG. 4.

Referring to FIG. 4, a lock detection circuit 400 of to an exemplary embodiment of the present invention includes a front-end lock detector 400A and a back-end lock detector 400B. The front-end lock detector 400A includes first and second delay devices D1 and D2, first and second D flip-flops FF1 and FF2, and a NOR gate NORG. The back-end lock detector 400B includes third and fourth D flip-flops FF3 and FF4 and an AND gate ANDG.

The lock detection circuit 400 may be integrated with a PLL circuit or may be separated from a PLL circuit and it can be applied to electronic devices such as communication systems, an FM receiver or a multimedia system, which require lock determination of a PLL circuit.

Operations of the front-end lock detector 400A will be described below.

The first and second delay devices D1 and D2 respectively receive an up signal UP and a down signal DN from a phase frequency detector (not shown) and delay them for a predetermined time period to respectively output the delayed up signal $\tau_{UP}$ and the delayed down signal $\tau_{DN}$.

Here, the delayed up signal $\tau_{UP}$ and the delayed down signal $\tau_{DN}$ are respectively input into each data input D of the first and second D flip-flops FF1 and FF2, and the down signal DN and the up signal UP are respectively input into each clock input CK of the first and second D flip-flops FF1 and FF2.

The first D flip-flop FF1 outputs the delayed up signal $\tau_{UP}$ at a rising edge of the down signal DN, and the second D flip-flop FF2 outputs the delayed down signal $\tau_{DN}$ at a rising edge of the up signal.

As illustrated in the timing diagram FIG. 5A, when the delayed up signal $\tau_{UP}$ is faster than the down signal DN, an output signal $Q_{DN}$ of the first D flip-flop FF1 becomes high, and when the delayed down signal $\tau_{DN}$ is faster than the up signal UP, an output signal $Q_{UP}$ of the second D flip-flop FF2 becomes high.

Next, the NOR gate NORG outputs a preliminary lock detection signal LS in a high state, when both the output signal $Q_{DN}$ of the first D flip-flop FF1 and the output signal $Q_{UP}$ of the second D flip-flop FF2 are in low states.

Here, state transition delay of the up signal Up or the down signal DN may make the preliminary lock detection signal LS output from the NOR gate NORG to be in a high sate, as represented in a dotted line of FIG. 5A, although it is not in a lock state.

Therefore, in the exemplary embodiment of the present invention, in order to prevent such a problem, only a preliminary lock detection signal LS maintaining a high state for a predetermined time period is output as a final lock detection signal LKD using the back-end lock detector 400B, which will be described below in more detail.

First, the preliminary lock detection signal LS output from the front-end lock detector 400A is input into D input of the third D flip-flop FF3, and an output y0 of the third D flip-flop FF3 is input into D input of the fourth D flip-flop FF4. Here, a reference signal is input into each CK of the third and fourth D flip-flops FF3 and FF4.

That is, the third D flip-flop FF3 delays the preliminary lock detection signal LS as long as a time interval of a reference signal FREF, and the fourth D flip-flop FF4 delays the preliminary lock detection signal that is delayed through the third D flip-flop FF3 again as long as the time interval of the reference signal FREF.

Outputs y0 and y1 of the third and fourth D flip-flops FF3 and FF4 are input into the AND gate ANDG, and the AND gate ANDG outputs a final lock detection signal LKD when the outputs y0 and y1 of the third and fourth D flip-flops FF3 and FF4 are high.

Therefore, when the back-end lock detector 400B receives the preliminary lock detection signal LS from the front-end lock detector 400A, it outputs only a preliminary lock detection signal LS maintaining a high state for a predetermined time period as a final lock detection signal LKD.

As described above, the lock detection circuit 400 of the present invention can accurately detect a lock state using a simple structure, and as a result, the lock detection circuit may be compact in size and consume less electric power. Further, when a lock state is detected using the lock detection circuit 400 of the present invention, lock state detection procedures may be simpler, and the lock state may be detected within a shorter time period.

In the lock detection circuit 400 according to the exemplary embodiment of the present invention, the back-end lock detector 400B may be modified. Also, in case that the front-end lock detector 400A accurately detects a preliminary lock detection signal in an actual lock state, the back-end lock detector 400B may be omitted.

According to the present invention, a lock detection circuit capable of detecting a lock state can be implemented in a simple structure, resulting in compact size and less consumption of electric power.

Also, according to the present invention, lock detection process may become simpler, and a lock state can be detected within a shorter time period.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A lock detection circuit comprising:
   a front-end lock detector configured to receive an up signal or a down signal based on a phase difference between a reference signal and a feedback signal, and to output a preliminary lock detection signal indicating lock states of the reference signal and the feedback signal according to the up signal or the down signal; and
   a back-end lock detector configured to receive the preliminary lock detection signal from the front-end lock detector to output a final lock detection signal that maintains a high state for a preset time period,
   wherein the front-end lock detector includes:
      first and second delay devices configured to respectively delay the up and down signals for a predetermined time period and to output delayed up and down signals;
      a first D flip-flop receiving the delayed up signal and outputting the received signal in response to the down signal;
      a second D flip-flop receiving the delayed down signal and outputting the received signal in response to the up signal; and
      a NOR gate configured to perform a NOR operation on output signals of the first and second D flip-flops to output a high or low preliminary lock detection signal,
   wherein the back-end lock detector includes:
      a third D flip-flop receiving the preliminary lock detection signal and delaying the received signal as long as a time interval of the reference signal;
      a fourth D flip-flop receiving an output signal of the thrid D flip-flop and delaying the output signal of the third D flip-flop as long as the time interval of the reference signal; and
      an AND gate configured to perform an AND operation on the output signals of the third and fourth D flip-flop to output the final lock detection signal that maintains an active state for the preset time period, and
   wherein the back-end lock detector includes only two D flip-flops and outputs the final lock detection signal without using a divider.

2. The circuit of claim 1, wherein the first D flip-flop outputs a high signal when the delayed up signal is faster than the down signal, and the second D flip-flop outputs a high signal when the delayed down signal is faster than the up signal.

3. The circuit of claim 1, wherein the front-end lock detector is connected to a circuit synchronizing a phase of the reference signal with that of the feedback signal.

4. A lock detecting method, comprising:
   delaying an up signal and a down signal for a predetermined time period when the up signal and the down signal are input according to a phase difference between a reference signal and a feedback signal;
   generating a first output signal when the delayed up signal is faster than the down signal, and generating a second output signal when the delayed down signal is faster than the up signal;
   generating and outputting a preliminary lock detection signal indicating lock states of the reference signal and the feedback signal according to the first and second output signals;

first delaying the preliminary lock detection signal using a first D flip-flop as long as a time interval of the reference signal;

second delaying the first delayed preliminary lock detection signal using a second D flip-flop as long as the time interval of the reference signal; and performing an AND operation on the first delayed preliminary lock detection signal and the second delayed preliminary lock detection signal to extract a final lock detection signal maintaining an active state for a preset time period, wherein the first delaying and the second delaying are performed using the reference signal whose frequency is not divided.

5. The method of claim 4, wherein in generating the first and second output signals, when the delayed up signal is faster than the down signal, the first output signal is in a high state, and when the delayed down signal is faster than the up signal, the second output signal is in a high state.

6. The method of claim 4, wherein in generating and outputting the preliminary lock detection signal, when the first and second output signals are in low states, the preliminary lock detection signal is in a high state.

7. The lock detection circuit of claim 1, wherein the final lock detection signal maintains a high state for the preset time period.

8. The method of claim 4, wherein the final lock detection signal maintains a high state for the preset time period.

9. A lock detecting method, comprising:

delaying an up signal and a down signal for a given time period when the up signal and the down signal are input according to a phase difference between a reference signal and a feedback signal;

generating a first output signal when the delayed up signal is faster than the down signal;

generating a second output signal when the delayed down signal is faster than the up signal;

generating and outputting a preliminary lock detection signal indicating lock states of the reference signal and the feedback signal according to the first and second output signals;

first delaying the preliminary lock detection signal using a first D flip-flop according to a time interval of the reference signal;

second delaying the first delayed preliminary lock detection signal using a second D flip-flop according to the time interval of the reference signal; and performing an AND operation on the first delayed preliminary lock detection signal and the second delayed preliminary lock detection signal to extract a final lock detection signal maintaining an active state for a given time period,.

wherein the first delaying and the second delaying are performed using the reference signal whose frequency is not divided.

10. The lock detecting method of claim 9, wherein the preliminary lock detection signal is delayed at least as long as a time interval of the reference signal, and wherein the first delayed preliminary lock detection signal is delayed at least as long as the time interval of the reference signal.

11. The lock detecting method of claim 9, wherein the preliminary lock detection signal is delayed as long as a time interval of the reference signal, and wherein the first delayed preliminary lock detection signal is delayed as long as the time interval of the reference signal.

* * * * *